United States Patent [19]

Spiro

[11] Patent Number: 5,380,557
[45] Date of Patent: Jan. 10, 1995

[54] CARBON FLUORIDE COMPOSITIONS

[75] Inventor: Clifford L. Spiro, Niskayuna, N.Y.

[73] Assignee: General Electric Company, Worthington, Ohio

[21] Appl. No.: 73,991

[22] Filed: Jun. 3, 1993

Related U.S. Application Data

[63] Continuation of Ser. No. 751,884, Aug. 29, 1991, abandoned.

[51] Int. Cl.$^6$ .......................... B05D 3/06; C23C 16/00
[52] U.S. Cl. .................................. 427/249; 427/577; 427/582; 427/575; 423/446
[58] Field of Search ................. 427/249, 255.1, 255.2, 427/255.6, 562, 573, 577, 580, 585, 587, 490, 522; 423/446

[56] References Cited

U.S. PATENT DOCUMENTS

| | | | |
|---|---|---|---|
| 4,228,142 | 10/1980 | Holcombe, Jr. et al. | 427/249 |
| 4,252,848 | 2/1981 | Datta et al. | 427/490 |
| 4,382,100 | 5/1983 | Holland | 427/577 |
| 4,718,907 | 1/1988 | Karwoski et al. | 427/490 |
| 4,770,940 | 9/1988 | Ovshinsky et al. | 423/445 |
| 4,981,717 | 1/1991 | Thaler | 427/38 |
| 5,034,265 | 7/1991 | Hoffman et al. | 427/490 |
| 5,045,355 | 9/1991 | Spiro et al. | 427/50 |
| 5,071,677 | 12/1991 | Patterson et al. | 427/249 |
| 5,089,290 | 2/1992 | Kleeberg et al. | 427/490 |
| 5,238,705 | 8/1993 | Hayashi et al. | 427/249 |
| 5,244,730 | 9/1993 | Nguyen et al. | 427/490 |
| 5,286,534 | 2/1994 | Kohler et al. | 427/577 |
| 5,314,570 | 5/1994 | Ikegaya et al. | 423/446 |
| 5,316,795 | 5/1994 | Patterson et al. | 427/249 |

FOREIGN PATENT DOCUMENTS

| | | |
|---|---|---|
| 0304220 | 2/1989 | European Pat. Off. . |
| 0353934 | 2/1990 | European Pat. Off. . |
| 0361206 | 4/1990 | European Pat. Off. . |

OTHER PUBLICATIONS

Inagaki et al "Plasma Polymerization of Perfluoro-2-Butyl Tetrahydrofuran/Methane and Perfluorobenzene/Tetrafluoromethane Mixtures and Gas Permeation Properties of Plasma Polymers", *Joun. of Appl. Polymer Science*, vol. 38, pp. 1869–1877 Nov. 1989.
Chemical Abstracts, vol. 101 No. 10, abstract no. 75278j 1984 no month.

*Primary Examiner*—Marianne Padgett

[57] ABSTRACT

Carbon fluoride solid compositions having a low fluorine-to-carbon ratio are produced by chemical vapor deposition processes. These carbon fluoride compositions have improved wettability characteristics over polytetrafluoroethylene. These compositions can be used as films, coatings on substrates, powders, and stand-alone articles. These carbon fluoride compositions are produced by energizing vapors comprised of compounds containing fluorine and carbon to cause them to degrade into fragments which are then condensed onto a substrate to form the carbon fluoride solids. These vapors can be energized by a variety of techniques, including hot filament techniques. The carbon fluoride solids find utility as films in aircraft de-icing, cookware, appliances, surgical tooling, chemical processing, gaskets, seals, diaphragms, packings, valve seats, windings, mold release components, extruder coatings, medical prosthetics, and other similar non-wetting applications.

8 Claims, No Drawings

CARBON FLUORIDE COMPOSITIONS

This is a continuation of copending application Ser. No. 07/751,884 filed on Aug. 29, 1991 now abandon.

BACKGROUND OF THE INVENTION

Non-wettable coatings have many applications, including medical prosthetics, surgical tools, aircraft de-icing, mold-release components, cookware, appliances, extruder coatings, chemical processing components, gaskets, seals, diaphragms, packings, linings, valve seats, and the like where wetting is undesirable.

Fluorocarbon polymers are well known, with polytetrafluoroethylene (PTFE), such as Du Pont TEFLON®; polytetrafluoropropylene; and polyvinylidene fluoride, dating back more than 50 years. These fluorocarbon polymers are known to provide non-wettable coatings and find use in many of the applications referred to above.

Graphite fluoride, another fluorinated carbon, was reported in 1934 by Ruff and Bretschneider in *Z. Annor. Allg. Chem.* 1 (217). Graphite fluoride is produced by direct fluorination of graphite carbon at about 600° C. The products are bulk white, non-aromatic solids. The products yielded are gray/black materials when the processing temperatures are reduced. The composition of the graphite fluoride ranges from $CF_{0.58-1.2}$.

While the fluorocarbon materials known in the art find use in many applications, improvements are desired in certain properties such as wettability characteristics. It is also desirable to provide non-wettable materials with improved temperature and chemical resistance, low friction, and high heat resistance.

SUMMARY OF THE INVENTION

It is an object of this invention to provide new carbon fluoride solid compositions having a low fluorine-to-carbon ratio and improved wettability characteristics.

It is another object of the present invention to provide films and coatings on substrates comprised of a carbon fluoride composition having wettability characteristics superior to polytetrafluoroethylene.

It is a further object of the present invention to provide a bulk mass of a non-wettable carbon fluoride composition which has high resistance to heat and chemicals.

In another aspect, it is an object of the present invention to provide a method for depositing carbon fluoride films and high adhesion coatings that are non-wettable and show resistance to both high temperatures and chemicals.

It is yet another object of the present invention to provide a chemical vapor deposition process for preparing carbon fluoride compositions having a low fluorine-to-carbon ratio.

Other objects will be apparent from the detailed disclosure and claims which follow.

The above objects are achieved by methods provided by the present invention for preparing carbon fluoride compositions which comprise energizing volatile compounds containing fluorine and carbon, preferably in an inert atmosphere, so as to degrade the compounds into fragments and condensing the energetic fragments onto a substrate upon which the fragments may rearrange into less energetic, more stable forms. Condensation of the fragments can yield films, high adhesion coatings, and bulk materials of a solid carbon fluoride composition having a low fluorine-to-carbon ratio.

DETAILED DESCRIPTION OF THE PREFERRED EMBODIMENTS

The methods of this invention can provide thermally stable carbon fluoride films, high adhesion coatings, and bulk materials by degradation of vapors comprised of compounds containing fluorine and carbon into fragments, followed by condensation of these fragments onto a substrate, preferably maintained at a temperature lower than the fragments, but generally maintained at a temperature high enough for the fragments to have sufficient mobility and energy to rearrange.

The vapors of compounds containing fluorine and carbon preferably comprise any aliphatic, cycloaliphatic, or aromatic fluorocarbon which can be vaporized in conventional chemical vapor deposition equipment, preferably at temperatures below about 200° C. These include those fluorocarbons which are gaseous at ambient temperature, such as tetrafluoroethylene, and those which are liquid, such as hexafluorobenzene. It is preferable for the compounds used not to contain atoms other than fluorine and carbon.

A preferred reactant is hexafluorobenzene, which is relatively high in molecular weight as compared to tetrafluoroethylene. Hexafluorobenzene can be expected to provide larger fragments for condensation on the substrate than tetrafluoroethylene. Small amounts of hydrogen within fluorohydrocarbon starting materials may be tolerated, and small amounts of halogen within fluorochlorocarbon starting materials, such as those in the Freon® series, may also be tolerated in the process of this invention; however, the structure and properties of the carbon fluoride films produced may vary.

The compounds containing fluorine and carbon can be vaporized by direct heating, or the vapor can be entrained in an inert gas such as argon, nitrogen, helium, and the like. This can be accomplished with compounds that are liquid at ambient temperature by bubbling a carrier gas through a heated volume of the compound.

Vapor flow rates for the compounds containing fluorine and carbon into the reaction vessel can vary widely. The rate at which the vapor is fed into the reaction vessel determines the growth rate of the carbon fluoride solid composition produced. The desired flow rate will depend on the equipment and starting material utilized, in addition to the rate of deposition desired. For hexafluorobenzene, flow rates of about 50 SCCM and pressures of about 5 psig in a conventional CVD apparatus have been found to be suitable where a deposition rate of 10 μm/hour is desired.

The vapors of compounds containing fluorine and carbon are energized so as to degrade them into fragments. This can be accomplished by (1) passing the vaporized compounds over a hot filament or through a hot furnace of suitable temperature or (2) exposing the compounds to microwave (RF) radiation of a sufficient intensity or (3) exposing the compounds to light of a frequency which initiates photolysis. The present invention is not limited by these methods to produce the necessary fragments.

Where a hot filament is used to energize the vapors, preferred temperatures fall within the range of 200°–3000° C., most preferably in the range of 1500°–2500° C. Temperatures within these ranges are also preferred where a hot furnace (oven) is used. The microwave intensity necessary to energize the vapors vary with the vapor flow rate and the starting material utilized. Those skilled in the art can readily determine the intensity of microwave radiation necessary utilizing a microwave (RF) generator with variable output. The frequency of light necessary for photolysis of the vapors will also vary with the starting material utilized. Those skilled in the art can determine the necessary frequency for the starting material desired.

Not wishing to be bound by theory, it is believed the degradation of the compounds containing fluorine and carbon produces fragments which are highly reactive; and, for this reason, it is necessary for the carrier gas utilized to be inert to these fragments.

Following degradation, the fragments are condensed onto one or more substrates, preferably maintained at a temperature lower than that of the fragments. The reduced temperature provides a target surface within the reactor. The substrate preferably has a temperature in the range of 20°–1000° C. and most preferably in the range 200°–500° C. Not wishing to be bound by theory, it is believed that the fragments react or recombine to form carbon fluoride compositions following condensation onto the substrate.

The ratio of fluorine to carbon for the carbon fluoride solid compositions of this invention is below 1.0. Not wishing to be bound by theory, it is believed this film has a diamondlike structure with carbon atoms positioned in a tetrahedral network that is interrupted with bonds to fluorine. This theory is based on (1) properties observed in films produced by the present invention which are similar to diamondlike carbon and distinct from polytetrafluoroethylene and (2) the known structure of carbon chalcogenide compositions produced by a similar technique in copending application Ser. No. 07/545,152, filed Jun. 28, 1990, which will issue on Sep. 3, 1991, as U.S. Pat. No. 5,045,355, and is assigned to the same assignee as the present invention.

The substrate on which the carbon fluoride solid compositions are deposited can be moving or stationary and comprise any thermally stable material such as metals, ceramics, and plastics, including quartz, aluminum, ceramic glass, molybdenum, tungsten, stainless steel, polyimide, potassium bromide, and sodium chloride.

The carbon fluoride solid compositions produced have been found to provide good coatings with high adhesion to the substrates on which they are formed. These coatings can be removed by conventional physical and chemical means to provide powders, films, or other bulk, stand-alone structures. The films and coatings can vary from submicron thicknesses, i.e., below about 0.01 μm, to 10,000 μm.

The carbon fluoride compositions deposited by the method of the present invention utilizing hexafluorobenzene have been found to have a contact angle in excess of 120° with water. For reference, TEFLON ® polytetrafluoroethylene has a contact angle of 92° when tested using the same techniques, although higher values have been reported for TEFLON ® in the literature; this measurement indicates the carbon fluoride compositions of the present invention are significantly less wettable than TEFLON ® films.

The films and coatings produced by the present invention can be used for aircraft de-icing, cookware, appliances, surgical tooling, chemical process components, gaskets, seals, diaphragms, packings, valve seats, linings, mold-release components, extruder coatings, medical prosthetics, and other similar non-wetting applications.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever.

In the foregoing and in the following examples, all temperatures are set forth uncorrected in degrees Celsius; and, unless otherwise indicated, all parts and percentages are by weight.

The entire disclosure of all applications, patents, and publications, cited above and below, are hereby incorporated by reference.

EXAMPLE

A conventional chemical vapor deposition device was utilized to perform the process of the present invention and obtain carbon fluoride compositions. This device is described with greater particularity in application Ser. No. 07/545,152, filed Jun. 28, 1990, which will issue Sep. 3, 1991, as U.S. Pat. No. 5,045,355.

Argon gas at 21 psig was allowed to flow through a hexafluorobenzene liquid, which was heated to 50° C. to yield a gas mixture. The flow rate of this gas mixture into the quartz reactor of the chemical vapor deposition device was regulated with a needle valve positioned adjacent to the source of the gas mixture. The flow rate was maintained at a value of about 50 SCCM at 5 mm Hg pressure with the aid of a vacuum exhaust. The gas mixture flowed over a heated tungsten filament positioned within the quartz reactor. The filament was maintained at a temperature of about 2000° C. An optical pyrometer was used to determine the filament temperature. A silicon wafer was positioned within the quartz reactor beneath the filament to function as the target substrate. Its position was adjusted to be about 1 cm below the heated filament. The temperature of the substrate was not controlled during operation of the chemical vapor deposition apparatus.

Metal/black coatings of solid carbon fluoride appeared on the silicon wafer within minutes of commencing the process. Growth rates of more than 10 micrometers/hour were observed. After a number of hours, the filament was switched off and the substrate allowed to cool. The coated substrate was then tested for wettability with water. The coatings produced were found to have a contact angle determined with water in excess of 120°. In contrast, bulk TEFLON ® (polytetrafluoroethylene) was found to have a contact angle of 92° when measured by the same technique.

The preceding example can be repeated with similar success by substituting the generically or specifically described reactants and/or operating conditions of this invention for those used in the preceding example.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. A method of preparing carbon fluoride solid compositions, comprising entraining hexafluorobenzene in an inert gas to form a gaseous mixture, energizing said gaseous mixture by passing said mixture over a hot tungsten filament at a temperature of about 1500°–2500° C. to form fragments and condensing said fragments onto a substrate at a temperature from about 200°–500° C. to form a coating comprising carbon fluoride solid compositions having a ratio of fluorine to carbon less than about 1.0 and a contact angle in excess of 120° with water, said coating having diamondlike structure with carbon atoms positioned in a tetrahedral network that is interrupted with bonds to fluorine.

2. A method as in claim 1, wherein the substrate is maintained at said temperature below that of said fragments.

3. A method as in claim 1, wherein the carbon fluoride solid composition is deposited at a rate of about 10 $\mu$m/hour to a total thickness in the range of 0.01 $\mu$m to about 10,000 $\mu$m.

4. A method as in claim 1, wherein the substrate is quartz, alumina, ceramic glasses, silicon dioxide, molybdenum, tungsten, stainless steel, polyimide, potassium bromide, or sodium chloride.

5. A process as in claim 1, comprising the additional step of removing from said substrate the carbon fluoride solid composition formed thereon.

6. A method as in claim 1, wherein said gaseous mixture flows through a reactor and said tungsten filament is positioned in said reactor.

7. A method as in claim 1, wherein said gaseous mixture flows through a reactor at about 50 SCCM.

8. A method as in claim 1, wherein a vacuum exhaust is provided for the flow of said gaseous mixture there through.

* * * * *